(12) United States Patent
Law et al.

(10) Patent No.: US 10,622,329 B2
(45) Date of Patent: Apr. 14, 2020

(54) BOND HEAD COOLING APPARATUS

(71) Applicants: Yi Kei Law, Kwai Chung (HK); Pak Kin Leung, Kwai Chung (HK); Chuek Wah Tang, Kwai Chung (HK); Gary Peter Widdowson, Kwai Chung (HK)

(72) Inventors: Yi Kei Law, Kwai Chung (HK); Pak Kin Leung, Kwai Chung (HK); Chuek Wah Tang, Kwai Chung (HK); Gary Peter Widdowson, Kwai Chung (HK)

(73) Assignee: ASM TECHNOLOGY SINGAPORE PTE LTD, Singapore (SG)

( * ) Notice: Subject to any disclaimer, the term of this patent is extended or adjusted under 35 U.S.C. 154(b) by 202 days.

(21) Appl. No.: 14/524,225

(22) Filed: Oct. 27, 2014

(65) Prior Publication Data

US 2016/0116217 A1   Apr. 28, 2016

(51) Int. Cl.
*H01L 23/00* (2006.01)
*H01L 23/473* (2006.01)
*H05K 7/20* (2006.01)

(52) U.S. Cl.
CPC .......... *H01L 24/75* (2013.01); *H01L 23/4735* (2013.01); *H01L 2224/75502* (2013.01); *H01L 2924/0002* (2013.01); *H05K 7/20345* (2013.01)

(58) Field of Classification Search
CPC .... F28C 3/08; H05K 7/2029; H05K 7/20009; H05K 7/20136; H05K 7/20145; H05K 7/20345; H05K 7/20809; H01L 23/46; H01L 23/467; H01L 23/473; H01L 23/4735; H01L 2224/7525; H01L 2224/75251; H01L 2224/75252; H01L 2224/75253; H01L 2224/82169; H01L 24/75; H01L 23/34
USPC .... 257/712–722, E23.1; 361/679.46–679.54, 361/688–723, 690; 239/132.5; 62/259.2; 228/4.5, 180.5
See application file for complete search history.

(56) References Cited

U.S. PATENT DOCUMENTS

| | | | | |
|---|---|---|---|---|
| 4,630,169 A * | 12/1986 | Kelly | ............... | B01D 17/045 239/690 |
| 4,897,762 A * | 1/1990 | Daikoku | ............ | H01L 23/4735 165/80.4 |
| 5,448,108 A * | 9/1995 | Quon | ................. | H01L 23/473 257/714 |
| 6,394,119 B2 * | 5/2002 | Ball | ................ | H01L 21/67017 137/1 |
| 7,044,768 B1 * | 5/2006 | Tilton | ............... | H01L 23/4735 257/E23.1 |
| 7,144,471 B2 * | 12/2006 | Kobayashi | ........... | B29C 43/36 156/272.2 |
| 7,477,513 B1 * | 1/2009 | Cader | ............... | H01L 23/4735 165/80.4 |

(Continued)

*Primary Examiner* — Alex M Valvis
(74) *Attorney, Agent, or Firm* — Ostrolenk Faber LLP

(57) ABSTRACT

A cooling apparatus is provided for a bond head which has a collet to hold a semiconductor die and a heater to heat the semiconductor die held by the collet. The cooling apparatus includes a dielectric liquid supply for supplying a dielectric liquid and a gas supply for supplying a gas. A spray nozzle is located next to a surface of the heater, and is connected to both the dielectric liquid supply and the gas supply. In order to cool the heater, the spray nozzle sprays a liquid-gas mixture of the dielectric liquid and the gas towards the surface of the heater.

16 Claims, 3 Drawing Sheets

(56) References Cited

U.S. PATENT DOCUMENTS

| | | | |
|---|---|---|---|
| 7,558,064 B2* | 7/2009 | Nakamura | G01R 31/2875 324/750.05 |
| 7,654,100 B2* | 2/2010 | Rini | F25B 1/00 62/259.2 |
| 8,029,622 B2* | 10/2011 | Miya | B08B 7/0014 134/30 |
| 8,814,067 B2* | 8/2014 | Freers | F26B 21/004 239/548 |
| 2001/0002541 A1* | 6/2001 | Patel | F25B 39/04 62/259.2 |
| 2004/0179337 A1* | 9/2004 | Lee | H01L 21/67109 361/700 |

* cited by examiner

BOND HEAD COOLING APPARATUS

FIELD OF THE INVENTION

The invention relates to bonding machines for electronic devices, and in particular to bond heads comprised in bonding machines which require heating and cooling of the bond heads during operation.

BACKGROUND AND PRIOR ART

In a bonding machine for electronic devices, such as a die bonding machine, an important module is the bond head. During a bonding process, the bond head is operative to hold a semiconductor die while a heater incorporated in the bond head heats the die. The heater then presses the die against a bonding site using a predetermined force and temperature profile. To heat the semiconductor die rapidly and thus reduce the bonding time, pulse heating is sometimes applied, followed by cooling (such as air cooling) to reduce the temperature of the die.

Conventional methods of actively cooling the bond head may involve the injection of compressed gas into the bond head. While introducing compressed gas on its own to cool the bond head is adequate for most purposes, the cooling rate is limited. It would be beneficial if one could achieve a better cooling rate and reduce gas consumption by employing improved cooling means.

SUMMARY OF THE INVENTION

It is thus an object of the invention to seek to provide a cooling apparatus for a bond head that achieves a faster cooling rate as compared to conventional air or gas-cooled systems.

According to a first aspect of the invention, there is provided a cooling apparatus for a bond head having a collet adapted to hold a semiconductor die and a heater which is adapted to heat the semiconductor die held by the collet, the cooling apparatus comprising: a dielectric liquid supply for supplying a dielectric liquid and a gas supply for supplying a gas; and a spray nozzle located next to a surface of the heater, the spray nozzle being operatively connected to both the dielectric liquid supply and the gas supply; wherein the spray nozzle is operative to spray a liquid-gas mixture comprising the dielectric liquid and the gas towards the surface of the heater for cooling the heater.

According to a second aspect of the invention, there is provided a bonding apparatus comprising: a collet adapted to hold a semiconductor die, and a heater which is adapted to heat the semiconductor die held by the collet; a dielectric liquid supply for supplying a dielectric liquid and a gas supply for supplying a gas; and a spray nozzle located next to a surface of the heater, the spray nozzle being operatively connected to both the dielectric liquid supply and the gas supply; wherein the spray nozzle is operative to spray a liquid-gas mixture comprising the dielectric liquid and the gas towards the surface of the heater for cooling the heater.

According to a third aspect of the invention, there is provided a method for cooling a bond head having a collet adapted to hold a semiconductor die and a heater which is adapted to heat the semiconductor die held by the collet, the method comprising; supplying a dielectric liquid from a dielectric liquid supply and a gas from a gas supply to a spray nozzle located next to the surface of the heater, the spray nozzle being operatively connected to both the dielectric liquid supply and the gas supply; and spraying from the spray nozzle a liquid-gas mixture comprising the dielectric liquid and the gas towards the surface of the heater for cooling the heater.

It would be convenient hereinafter to describe the invention in greater detail by reference to the accompanying drawings which illustrate one preferred embodiment of the invention. The particularity of the drawings and the related description is not to be understood as superseding the generality of the broad identification of the invention as defined by the claims.

BRIEF DESCRIPTION OF THE DRAWINGS

An example of a cooling apparatus in accordance with the invention will now be described with reference to the accompanying drawings, in which.

DETAILED DESCRIPTION OF THE PREFERRED EMBODIMENT OF THE INVENTION

Figure 1:
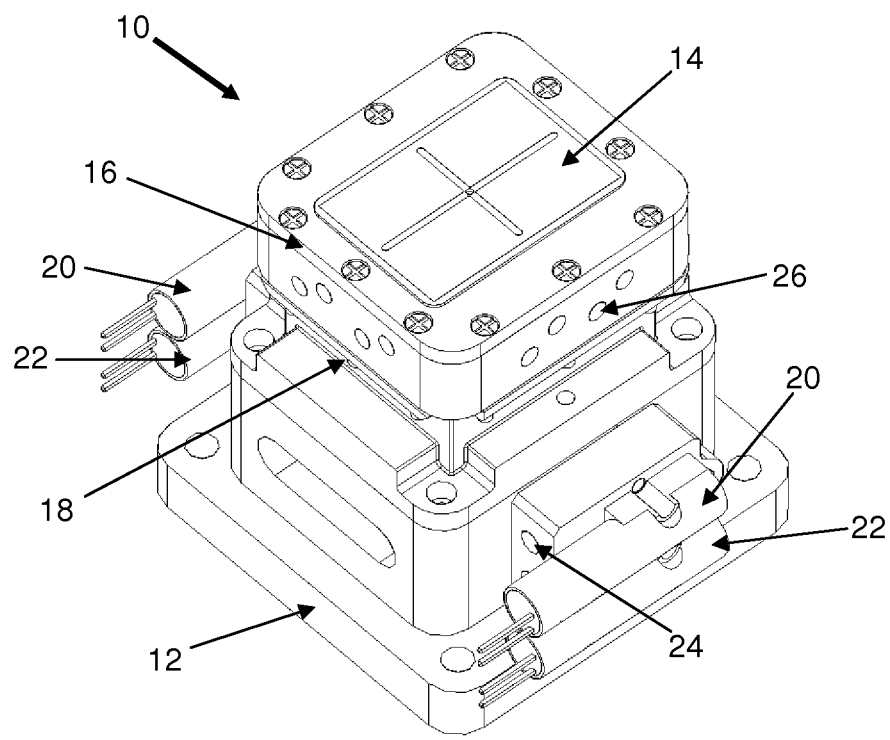
FIG. 1 is an isometric view of a bond head comprising a cooling apparatus according to the preferred embodiment of the invention.

FIG. 1 is an isometric view of a bond head 10 comprising a cooling apparatus according to the preferred embodiment of the invention. The bond head 10 has been inverted to illustrate a collet 14 of the bond head which is adapted hold a semiconductor die (not shown) during die bonding.

During a die bonding process, the bond head 10 may be heated to about 350° C. for melting solder balls attached to the semiconductor die so as to bond the semiconductor die to a substrate. Thereafter, it is beneficial to cause the solder balls to solidify as quickly as possible to harden the solder ball joints, with the objective of increasing productivity and quality.

At one end of the bond head 10, there is a base 12 which is adapted for attaching the bond head 10 to a bond head column of a die bonding machine (not shown) in use. A collet 14 is situated at an opposite end of the bond head 10, on which a semiconductor die may be held during die bonding. The collet 14 is in turn supported on a block comprising a heater 16. The heater 16 is operative to heat the collet 14 and a semiconductor die which is held on the collet 14 during a die bonding process.

An insulation block 18 is located behind the heater 16 to reduce the transmission of heat from the heater 16 to the base 12. For the control of dielectric liquid and gas ejected towards the heater 16, at least one pair of liquid solenoid valves 20 and at least one pair of gas solenoid valves 22 are mounted next to the base 12. Preferably, the pairs of liquid and gas solenoid valves 20, 22 are mounted on opposite sides of the bond head 10 to promote even distribution of the dielectric liquid and gas that are introduced. Gas and liquid inlets 24 introduce gas and dielectric liquid into the cooling apparatus for the purpose of cooling the bond head 10.

Thereafter, gas and dielectric liquid used for cooling the bond head 10 are extracted from the bond head 10 via one or more exhaust outlets 26.

Figure 2:
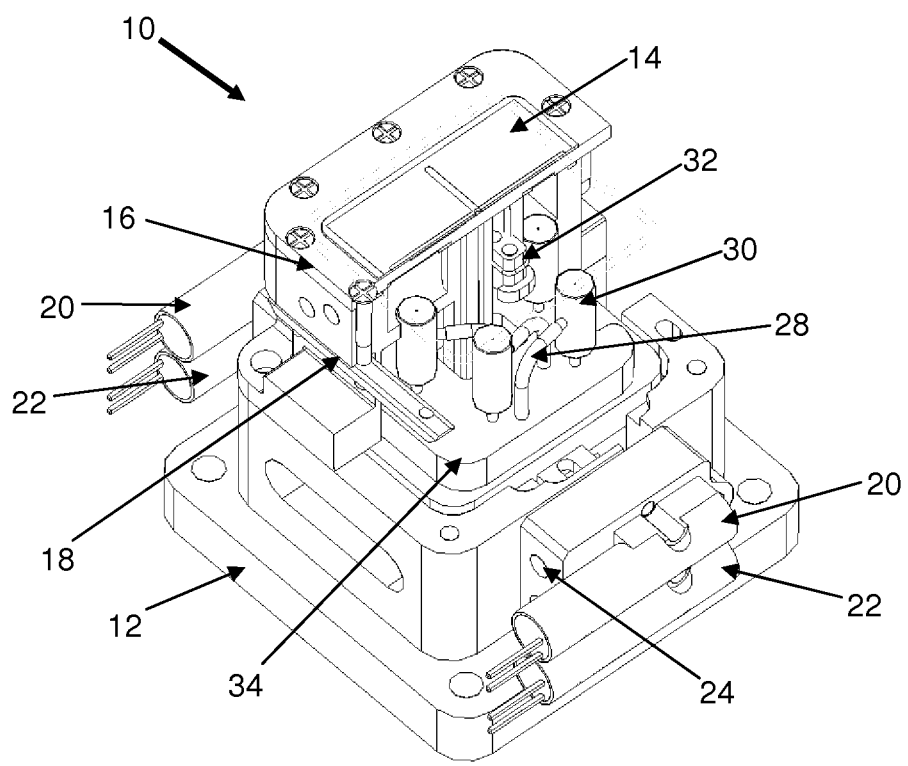
FIG. 2 is an isometric view of the bond head of FIG. 1 with part of its collet and heater removed to illustrate its cooling apparatus.

FIG. 2 is an isometric view of the bond head 10 of FIG. 1 with part of its collet 14 and heater 16 removed to illustrate its cooling apparatus. Underneath the heater 16, gas connectors 28 are mounted for transmitting gas from a gas and liquid chamber 34 incorporated within the bond head 10 to a plurality of spray nozzles 30 located next to a surface of the heater 16 for directing cooling sprays comprising a mixture of dielectric liquid and gas towards the surface of the heater 16. In addition to the insulation block 18, insulative O-rings 32 are installed between the heater 16 and the insulation block 18 for sealing purposes.

Figure 3:
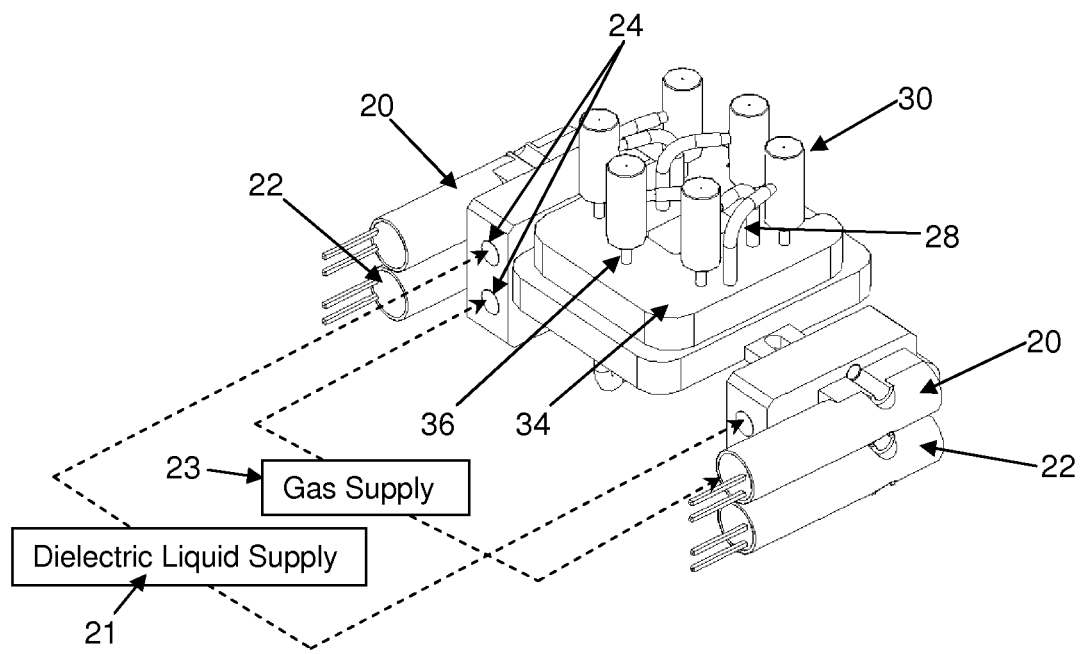
FIG. 3 is an isometric view of the cooling apparatus that is incorporated into the bond head of FIG. 1.

FIG. 3 is an isometric view of the cooling apparatus that is incorporated into the bond head 10 of FIG. 1. The cooling apparatus generally includes gas and liquid inlets 24 which receive dielectric liquid from a dielectric liquid supply 21 and gas from a gas supply 23, and respective liquid and gas solenoid valves 20, 22 which control the introduction of dielectric liquid and gas through the gas and liquid inlets 24 into the gas and liquid chamber 34.

The gas and liquid chamber 34 comprises a gas chamber connected to a gas inlet and a liquid chamber connected to a liquid inlet of the gas and liquid inlets 24. The gas and liquid chamber 34 is connected to the spray nozzles 30 so that gas and dielectric liquid respectively which are received in the gas and liquid chamber 34 may be ejected in the form of sprays comprising both gas and dielectric liquid from the spray nozzles 30 when cooling of the heater 16 is required.

Figure 4:
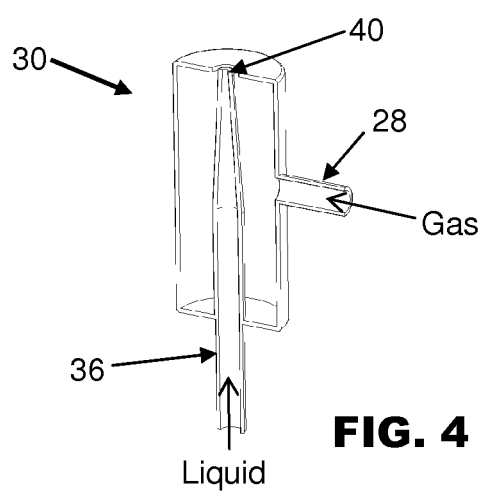
FIG. 4 is a sectional view of a spray nozzle comprised in the cooling apparatus.

FIG. 4 is a sectional view of a spray nozzle 30 comprised in the cooling apparatus. Compressed gas received in the gas and liquid chamber 34 is introduced to the spray nozzle 30 by way of the gas connectors 28, whereas dielectric liquid received in the gas and liquid chamber 34 is introduced to the spray nozzle 30 by way of separate liquid connectors 36. The gas connectors 28 and liquid connectors 36 operatively connect the spray nozzles 30 to the gas supply 23 and the dielectric liquid supply 21. A liquid-gas mixture that is mixed or combined in the spray nozzle 30 is ejected from the spray nozzle 30 onto the heater 16, preferably in the form of a spray of mist, from a spray outlet 40 of the spray nozzle 30.

Figure 5:
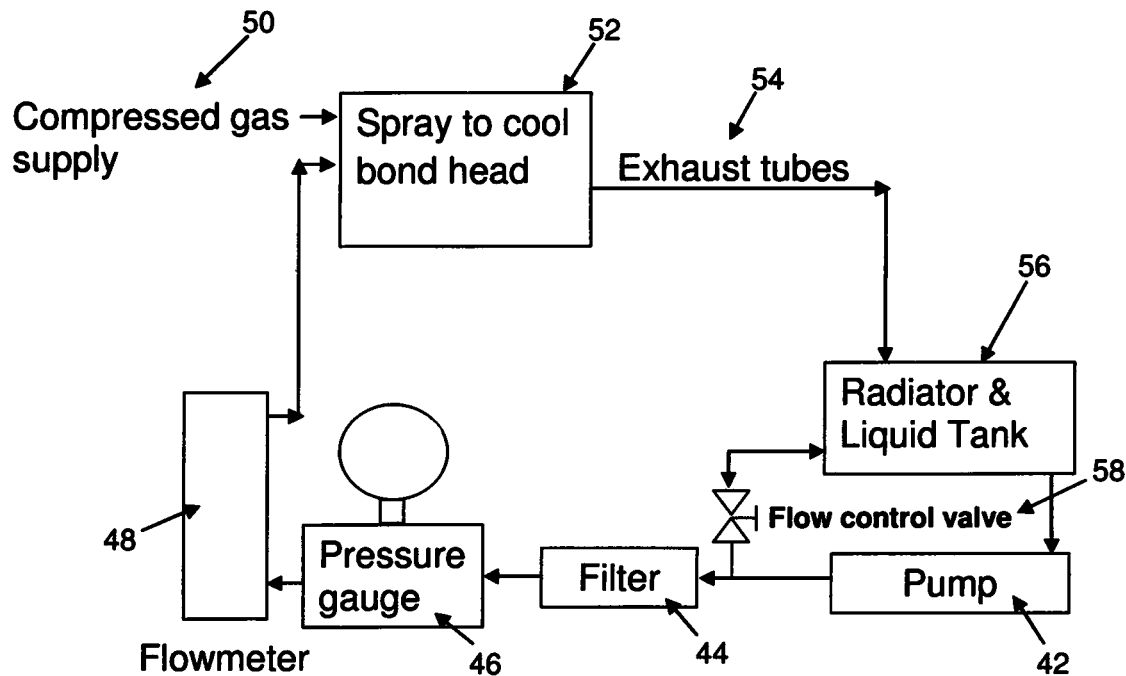
FIG. 5 is a recirculation system which may be used with the cooling apparatus illustrated in FIG. 1.

FIG. 5 is a recirculation system which may be used with the cooling apparatus illustrated in FIG. 1. The recirculation system generally comprises a liquid pump 42, a liquid filter 44, a gas supply 23 in the form of a compressed gas supply 50, exhaust tubes 54 and a dielectric liquid supply 21 in the form of a radiator and liquid tank 56.

A liquid pump 42 is used to pump a cooling dielectric liquid through a liquid filter 44, the liquid filter 44 being operative to remove debris from the dielectric liquid. A pressure gauge 46 and a flowmeter 48 determine the pressure and amount of dielectric liquid that is being transmitted to the spray nozzles 30. At the spray nozzles 30, compressed gas from the compressed gas supply 50 is added to the dielectric liquid and the mixture is sprayed onto the heater 16 in order to cool the heater 16.

Thereafter, the used gas and dielectric liquid are exhausted from the one or more exhaust outlets 26 and through exhaust tubes 54 to the radiator and liquid tank 56, where the used dielectric liquid is cooled by a radiator before it is collected in a liquid tank for recycling. Recycled dielectric liquid is introduced to the pump 42 again for re-use, with a flow control valve 58 controlling the feeding of dielectric liquid from the radiator and liquid tank 58 to the pump 42. The pump 42 will again pump dielectric liquid to cool the heater 16.

Figure 6:
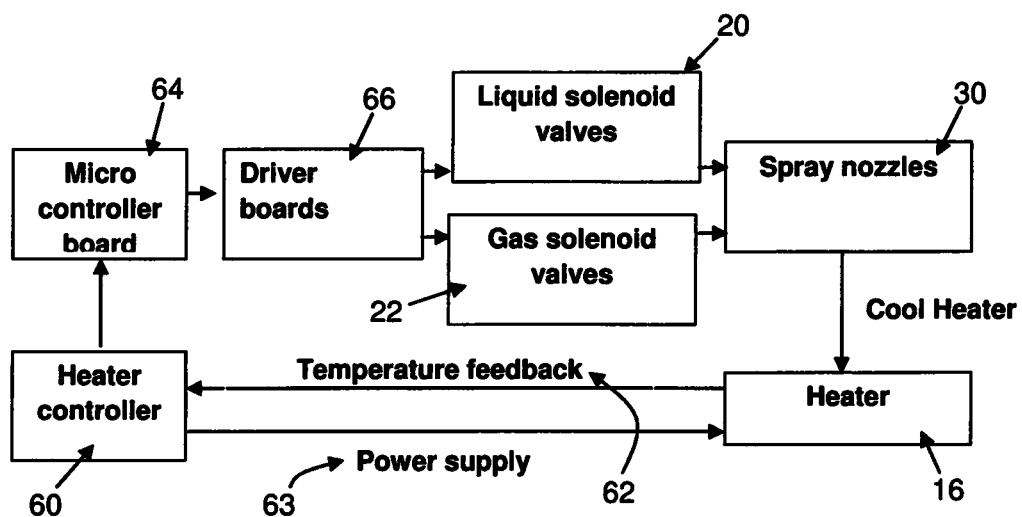
FIG. 6 is a liquid spray control system which may be used with the cooling apparatus illustrated in FIG. 1.

FIG. 6 is a liquid spray control system which may be used with the cooling apparatus illustrated in FIG. 1. A heater controller 60 receives temperature feedback 62 from the heater 16, and relying on such temperature feedback controls a power supply 63 for powering the heater 16. When the heater controller 60 senses that the heater 16 needs to be cooled, the heater controller 60 activates a microcontroller board 64 to send signals to driver boards 66 for initiating the generation of a cooling spray. The heater controller 60 is further configured to control respective proportions of the dielectric liquid and the gas in the liquid-gas mixture being ejected from the spray nozzles 30, by way of its control of the liquid solenoid valves 20 and the gas solenoid valves 22 via the microcontroller board 64.

The driver boards 66 will then activate the liquid solenoid valves 20 to inject dielectric liquid into the gas and liquid chamber 34 and the gas solenoid valves 22 will inject compressed gas into the gas and liquid chamber 34. From the gas and liquid chamber 34, gas and dielectric liquid are separately introduced to the spray nozzles 30, where the mixture of gas and dielectric liquid is sprayed onto the heater 16 in the form of a mist to cool the heater 16.

Hence, dielectric liquid is ejected and mixed with compressed gas to form a spray or mist which is propelled onto a hot surface of the heater 16 for rapid cooling. In order to enhance the cooling performance, the surface of the heater 16 may include fins and may further be coated with an evaluation layer to reduce the film boiling effect. The cooling rate of the heater 16 is controllable by adjusting the operating parameters of the solenoid valves 20, 22. The microcontroller board 64 will signal the solenoid valves 20, 22 to be activated to deliver a desired gas and dielectric liquid mixture onto the heater 16. An evaporation temperature of the dielectric liquid selected is lower than an operating temperature of the surface of the heater 16 to ensure that no dielectric liquid droplets are left in the cooling chamber next to the surface of the heater 16 during cooling. Furthermore, the heated vapor will be cooled down by means of the radiator to be condensed, and then fed into the liquid tank for recycling.

The cooling rate during the whole cooling process may be adjusted by applying different dielectric liquid/gas flow rates in the supply of the dielectric liquid and the gas. This control allows flexibility to adjust the cooling rate in real time. Furthermore, the cooling rate can be manipulated so that the heater 16 is more durable and has a longer lifespan. For instance, a constant cooling rate may be used all the time, or the cooling rate may be slower at first, followed by a faster cooling rate.

It should be appreciated that thermal cooling rate of the heater 16 may be significantly improved by using the cooling apparatus according to the described embodiment of the invention. Sprays comprising compressed gas and dielectric liquid are propelled directly onto the surface of the heater 16, and the sprays are more easily evaporated as compared to conventional liquid-cooled approaches to cool down the heater 16. It has been found that the use of a dielectric liquid, such as distilled water, in the aforementioned liquid-gas spray cooling approach allows the cooling apparatus to achieve a cooling rate of 100° C. per second or higher.

It has also been found that by using latent heat (or evaporative) cooling, the greatly reduced water flow rate and compact structures led to reduced water flow rate and supply pressure. This makes the entire cooling apparatus more compact. Further, since the solenoid valves 20, 22 are located on the sides of bond head, and are connected to the spray nozzles 30 by short connectors 28, 36, closed loop control over the spraying process to achieve a rapid cooling rate is enabled.

In terms of application flexibility, the two sets of solenoid valves 20, 22 with individual cycle control enables the creation of different compositions of gas and dielectric liquid to form the cooling sprays or jets. As such, the cooling rate during the cooling process is adjustable by applying different gas/liquid flow rates. The temperature insulation measures used ensure that the bond head 10 as a whole is not sensitive to temperature changes at the heater 16, and more precise temperature control is possible.

The invention described herein is susceptible to variations, modifications and/or additions other than those specifically described and it is to be understood that the invention includes all such variations, modifications and/or additions which fall within the spirit and scope of the above description.

The invention claimed is:

1. A bond head comprising:
    a base at one end of the bond head;
    a collet at another end of the bond head opposite the one end, the collet having a first side and a second side opposite the first side, the first side of the collet being configured to hold a semiconductor die during bonding of the semiconductor die;
    a heater, the collet being supported on the heater, the heater being in contact with the second side of the collet, the heater being operative to heat the collet;
    a cooling apparatus having a spray nozzle; and
    inlets connecting the cooling apparatus to a dielectric liquid supply for supplying a dielectric liquid and a gas supply for supplying a gas;
    wherein the spray nozzle is located next to a surface of the heater such that the heater separates the spray nozzle from the collet, the spray nozzle being operatively connected to both the dielectric liquid supply and the gas supply via the inlets;
    wherein the spray nozzle is operative to spray a liquid-gas mixture comprising the dielectric liquid and the gas directly onto the surface of the heater for cooling the heater, and
    wherein the collet, the heater, and the cooling apparatus are supported by the base.

2. The bond head as claimed in claim 1, further comprising a gas chamber connected to the gas supply and a liquid chamber connected to the dielectric liquid supply, the gas and liquid chambers being in fluid communication with the spray nozzle for receiving the gas and the dielectric liquid respectively before they are supplied to the spray nozzle for ejection.

3. The bond head as claimed in claim 2, further comprising a plurality of spray nozzles located next to the surface of the heater which are in fluid communication with the gas and liquid chambers for spraying the liquid-gas mixture towards the surface of the heater.

4. The bond head as claimed in claim 1, further comprising a gas connector attached to the spray nozzle which operatively connects the spray nozzle to the gas supply, and a separate liquid connector attached to the spray nozzle which operatively connects the spray nozzle to the dielectric liquid supply, wherein the gas and the dielectric liquid are mixed in the spray nozzle before ejection.

5. The bond head as claimed in claim 1, further comprising one or more exhaust outlets connected to the bond head through which used dielectric liquid is extracted from the bond head and recycled to the dielectric liquid supply.

6. The bond head as claimed in claim 5, wherein the dielectric liquid supply comprises a liquid tank which includes used dielectric liquid that has been extracted from the bond head through the one or more exhaust outlets.

7. The bond head as claimed in claim 6, further comprising a radiator connected to the liquid tank, the radiator being operative to cool the used dielectric liquid before the used dielectric liquid is supplied into the liquid tank.

8. The bond head as claimed in claim 7, further comprising a pressure gauge and a flowmeter to determine the pressure and amount respectively of the dielectric liquid that is being supplied to the spray nozzle.

9. The bond head as claimed in claim 1, further comprising a heater controller which receives temperature feedback from the heater and which controls a power supply to power the heater, the heater controller being further operative to initiate the supply of dielectric liquid and gas to the spray nozzle.

10. The bond head as claimed in claim 9, wherein the heater controller is further configured to control respective proportions of the dielectric liquid and the gas in the liquid-gas mixture being ejected from the spray nozzle.

11. The bond head as claimed in claim 1, wherein respective flow rates of the supply of the dielectric liquid and the gas are adjustable for varying a cooling rate of the cooling apparatus.

12. The bond head as claimed in claim 1, wherein the dielectric liquid has an evaporation temperature which is lower than an operating temperature of the surface of the heater.

13. The bond head as claimed in claim 1, wherein the liquid-gas mixture is sprayed from the spray nozzle in the form of a mist towards the surface of the heater.

14. The bond head as claimed in claim 1, wherein the dielectric liquid comprises distilled water.

15. An apparatus comprising:
    a bond head that includes,
    a base at one end of the bond head;
    a collet at another end of the bond head opposite the one end, the collet having a first side and a second side opposite the first side, the first side of the collet being configured to hold a semiconductor die during bonding of the semiconductor die;
    a heater, the collet being supported on the heater, the heater being in contact with the second side of the collet, the heater being operative to heat the collet;
    a cooling apparatus having a spray nozzle; and
    inlets connecting the cooling apparatus to a dielectric liquid supply for supplying a dielectric liquid and a gas supply for supplying a gas;
    wherein the spray nozzle is located next to a surface of the heater such that the heater separates the spray nozzle from the collet, the spray nozzle being operatively connected to both the dielectric liquid supply and the gas supply via the inlets;
    wherein the spray nozzle is operative to spray a liquid-gas mixture comprising the dielectric liquid and the gas directly onto the surface of the heater for cooling the heater, and
    wherein the collet, the heater, and the cooling apparatus are supported by the base, and the apparatus further comprising, a gas chamber connected to the gas supply and a liquid chamber connected to the dielectric liquid supply, the gas and liquid chambers being in fluid communication with the spray nozzle for receiving the gas and the dielectric liquid respectively before they are supplied to the spray nozzle for ejection; and at least two liquid solenoid valves connected to opposite sides of the liquid chamber between the liquid chamber and the dielectric liquid supply for controlling the flow of the dielectric liquid to the spray nozzle.

16. An apparatus comprising:

a bond head that includes, a base at one end of the bond head;

a collet at another end of the bond head opposite the one end, the collet having a first side and a second side opposite the first side, the first side of the collet being configured to hold a semiconductor die during bonding of the semiconductor die;

a heater, the collet being supported on the heater, the heater being in contact with the second side of the collet, the heater being operative to heat the collet;

a cooling apparatus having a spray nozzle; and inlets connecting the cooling apparatus to a dielectric liquid supply for supplying a dielectric liquid and a gas supply for supplying a gas;

wherein the spray nozzle is located next to a surface of the heater such that the heater separates the spray nozzle from the collet, the spray nozzle being operatively connected to both the dielectric liquid supply and the gas supply via the inlets;

wherein the spray nozzle is operative to spray a liquid-gas mixture comprising the dielectric liquid and the gas directly onto the surface of the heater for cooling the heater, and wherein the collet, the heater, and the cooling apparatus are supported by the base, and the apparatus further comprising, a gas chamber connected to the gas supply and a liquid chamber connected to the dielectric liquid supply, the gas and liquid chambers being in fluid communication with the spray nozzle for receiving the gas and the dielectric liquid respectively before they are supplied to the spray nozzle for ejection; and at least two gas solenoid valves connected to opposite sides of the gas chamber between the gas chamber and the gas supply for controlling the flow of gas to the spray nozzle.

* * * * *